(12) United States Patent
Juds et al.

(10) Patent No.: US 9,746,500 B2
(45) Date of Patent: Aug. 29, 2017

(54) ELECTRICAL CURRENT SENSING APPARATUS

(71) Applicant: Eaton Corporation, Cleveland, OH (US)

(72) Inventors: Mark Allan Juds, New Berlin, WI (US); Dale Richard Ludwig, Trevor, WI (US)

(73) Assignee: Eaton Corporation, Cleveland, OH (US)

( * ) Notice: Subject to any disclaimer, the term of this patent is extended or adjusted under 35 U.S.C. 154(b) by 504 days.

(21) Appl. No.: 14/444,141

(22) Filed: Jul. 28, 2014

(65) Prior Publication Data

US 2015/0160272 A1   Jun. 11, 2015

Related U.S. Application Data

(63) Continuation-in-part of application No. 14/102,660, filed on Dec. 11, 2013, now Pat. No. 9,134,351, and a continuation-in-part of application No. 14/102,675, filed on Dec. 11, 2013.

(51) Int. Cl.
*G01R 15/20* (2006.01)
*H01H 33/02* (2006.01)

(52) U.S. Cl.
CPC ......... *G01R 15/207* (2013.01); *H01H 33/027* (2013.01)

(58) Field of Classification Search
CPC .... G01R 15/202; G01R 23/02; G01R 15/207; G01R 25/00; G01N 2203/0025; G01N 3/24

USPC ...... 324/227–262, 200, 529, 750.12, 750.21, 324/754.17, 754.26, 500
See application file for complete search history.

(56) References Cited

U.S. PATENT DOCUMENTS

| | | |
|---|---|---|
| 4,492,919 A | 1/1985 | Milkovic |
| 6,087,800 A | 7/2000 | Becker et al. |
| 6,130,599 A | 10/2000 | Juds et al. |
| 6,271,656 B1 | 8/2001 | Juds et al. |
| 7,157,898 B2 | 1/2007 | Hastings et al. |
| 7,298,133 B2 | 11/2007 | Hastings et al. |
| 2005/0030018 A1* | 2/2005 | Shibahara ............. G01R 15/20 324/251 |
| 2006/0139117 A1* | 6/2006 | Brunker ................. H01P 3/081 333/1 |
| 2010/0156394 A1 | 6/2010 | Ausserlechner et al. |

(Continued)

FOREIGN PATENT DOCUMENTS

| | | |
|---|---|---|
| DE | 19946935 A1 | 5/2001 |
| EP | 0359886 A1 | 3/1990 |
| WO | 2013038867 A1 | 3/2013 |

*Primary Examiner* — Melissa Koval
*Assistant Examiner* — Trung Nguyen
(74) *Attorney, Agent, or Firm* — Ziolkowski Patent Solutions Group, SC

(57) ABSTRACT

A current sensing apparatus is disclosed that provides improved immunity to external magnetic fields, enhanced resolution, and a wide sensing range. The current sensing apparatus includes a conductor having a plurality of current path regions formed therein, which are separated by a pair of slots formed through the conductor. A pair of magnetic field sensors is positioned relative to the pair of slots to sense a magnetic field produced by a current flow through one of the current path regions.

20 Claims, 6 Drawing Sheets

(56) References Cited

U.S. PATENT DOCUMENTS

2011/0221429 A1    9/2011   Tamura
2013/0076341 A1    3/2013   Ausserlechner

* cited by examiner

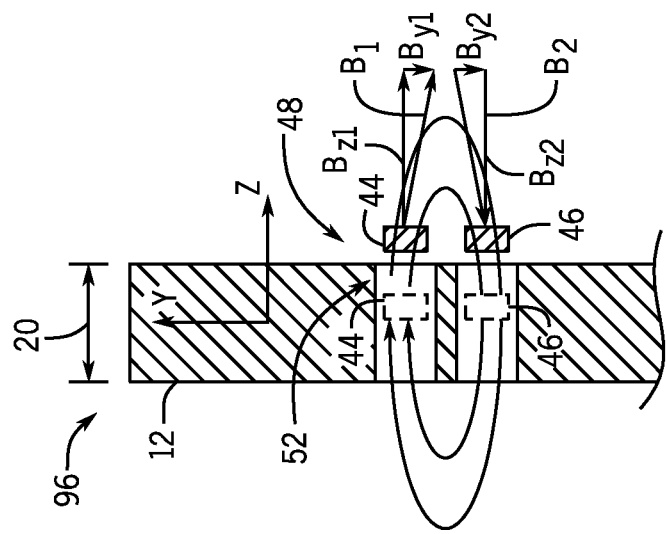
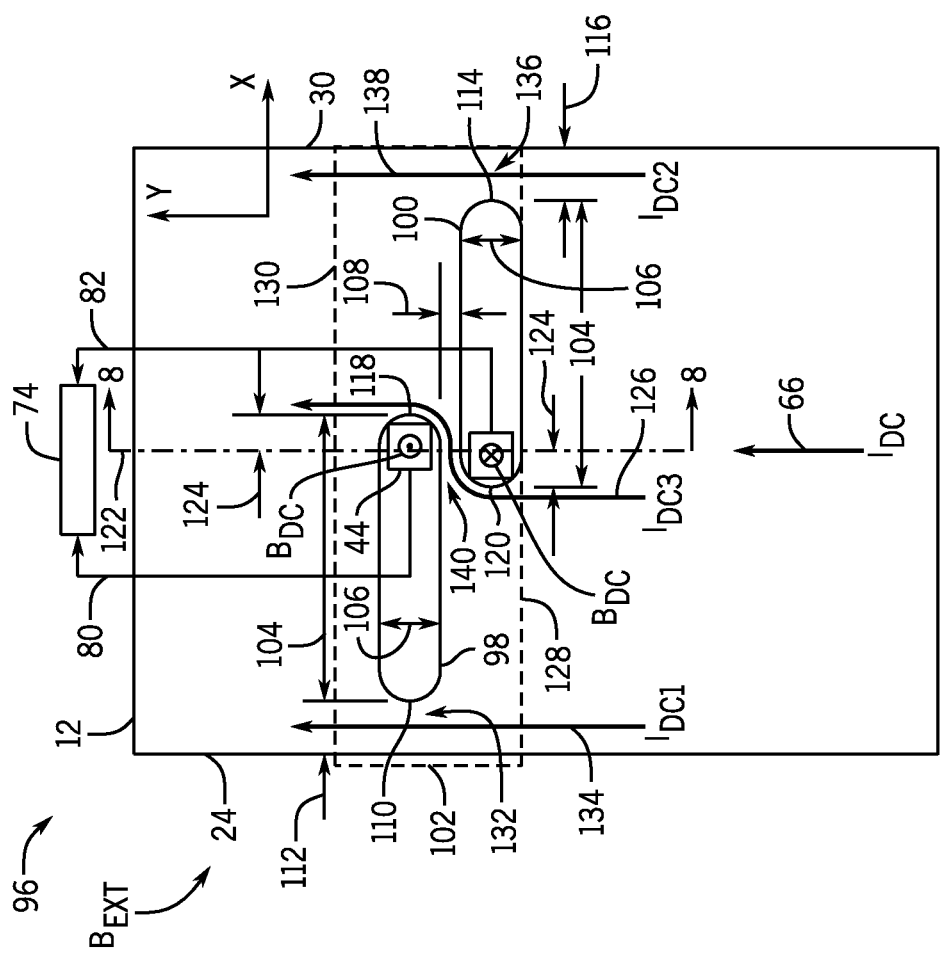
FIG. 8
FIG. 7

ELECTRICAL CURRENT SENSING APPARATUS

CROSS-REFERENCE TO RELATED APPLICATION

The present application is a continuation in part of, and claims priority to, U.S. non-provisional application Ser. No. 14/102,660, filed Dec. 11, 2013, and a continuation in part of, and claims priority to, U.S. non-provisional application Ser. No. 14/102,675, filed Dec. 11, 2013, the disclosures of which are incorporated herein by reference in their entireties.

BACKGROUND OF THE INVENTION

Embodiments of the invention relate generally to current sensors and, more particularly, to an apparatus for sensing electrical current flowing through a conductor.

Electrical switching apparatus, such as circuit interrupters, relays, and motor soft starters, often include one or more current sensor configured to measure the current flowing through the electrical switching apparatus. Known current sensors include a current transformer with a matching current meter, a ferrite toroid with matching current meter or printed circuit board assembly, and a Rogowski coil and matching circuit board assembly.

Alternatively, the electrical switching apparatus may include magnetic field sensors that measure current using similar principles as a transformer—namely, a magnetic field is induced around a conductor as current is passed through the conductor. This magnetic field is induced into a magnetic core constructed of a core material that can range from a highly magnetic material such as ferrous magnetic iron or steel, or a very weak magnetic material such as air. A second coil is looped around the magnetic coil material or around the current carrying member. The amount of current induced into the second coil is used to determine the current flowing through the conductor.

Each of the aforementioned current sensors includes a physical limitation that is a major disadvantage in constructing a compact electrical switching apparatus. Transformer, toriod, or Rogowski coil sensors often require bulky mounting brackets. The second coil or ferrite core of magnetic field sensors must be positioned about the periphery of the conductor of interest and results in an undesirable increase in the overall package size of the electrical switching apparatus. Further, in multi-phase devices such as a three phase motor starter that includes separate, closely spaced conductors, the potential for cross-talk, or interference between the current sensors becomes quite high.

In addition to being susceptible to external magnetic fields, present magnetic field current sensors are also limited in their sensing range and resolution. While some known sensors incorporate a corresponding circuit to amplify the output signals of the magnetic field sensors and achieve greater sensing range and higher resolution, there is room for improvement in the sensing range of magnetic field sensors.

Accordingly, it would be desirable to have a current sensor assembly that has a wide sensing range and enhanced resolution. It would further be desirable for such a current sensor assembly to provide improved immunity to external magnetic fields.

BRIEF DESCRIPTION OF THE INVENTION

Embodiments of the present invention provide a current sensor assembly with a wide sensing range, enhanced resolution, and improved immunity to external magnetic fields.

According to one aspect of the invention, current sensing apparatus includes a conductor configured to carry a current flow, the conductor having a current sensing region formed therein. The current sensing region includes a first edge current path region disposed between a first edge of the conductor and a first slot formed through a thickness of the conductor, a second edge current path region disposed between a second edge of the conductor and a second slot formed through the thickness of the conductor, the second edge opposite the first edge, and a central current path region disposed between the first slot and the second slot. A first magnetic field sensor is aligned with the first slot and a second magnetic field sensor aligned with the second slot.

According to another aspect of the invention, a current sensing apparatus includes a conductor having a plurality of discrete current path regions formed therein, the plurality of current path regions separated by a plurality of slots formed through a thickness of the conductor. The current sensing apparatus also includes a pair of magnetic field sensors positioned to sense a magnetic field in a central current path region of the plurality of current path regions.

According to yet another aspect of the invention, a current sensing apparatus includes a bus bar having a plurality of slots formed therein, the bus bar having a first current path region, a second current path region, and a central current path region positioned between the first and second current path regions. A pair of magnetic field sensors is disposed between the first current path region and the second current path region to sense a magnetic field produced by a current flow through the central current path region.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings:

FIG. 7 is a schematic top view of a current sensing assembly incorporated into a conductor according another embodiment of the invention.

FIG. 8 is a sectional view of the current sensing assembly of FIG. 7 according to an embodiment of the invention.

DETAILED DESCRIPTION

Figure 1:
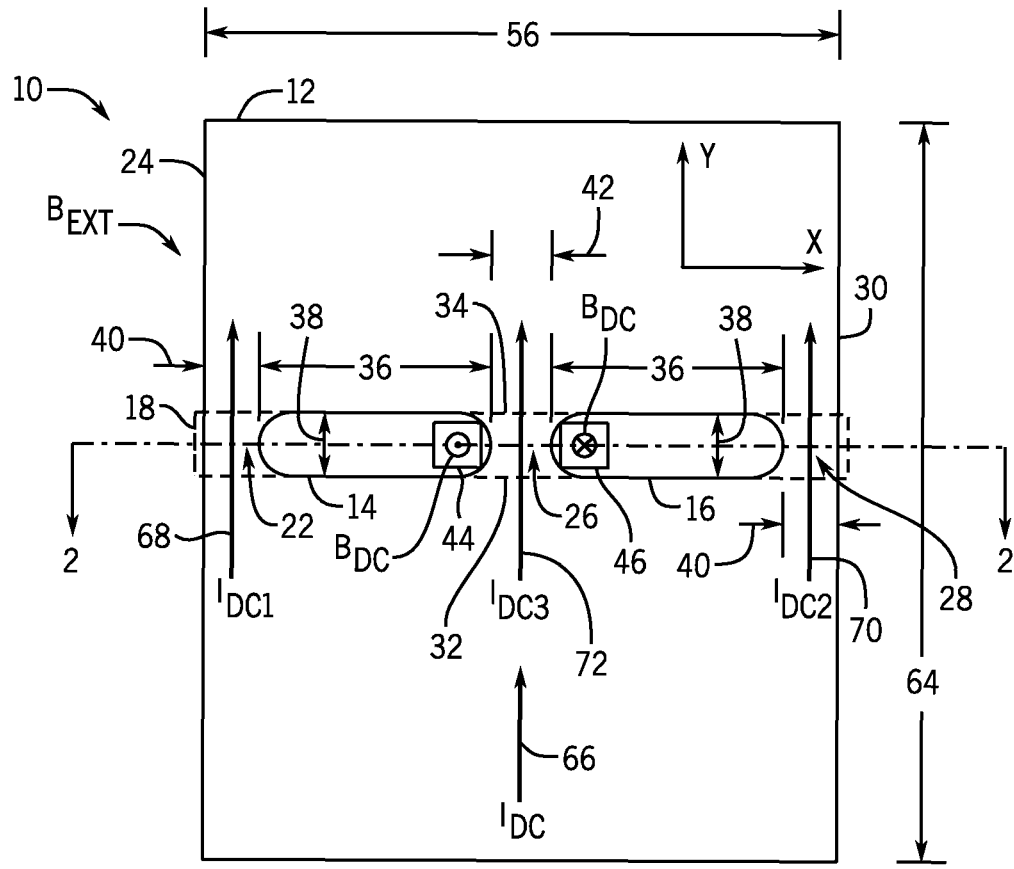
FIG. 1 is a schematic top view of a current sensing assembly according to an embodiment of the invention.
Figure 2:
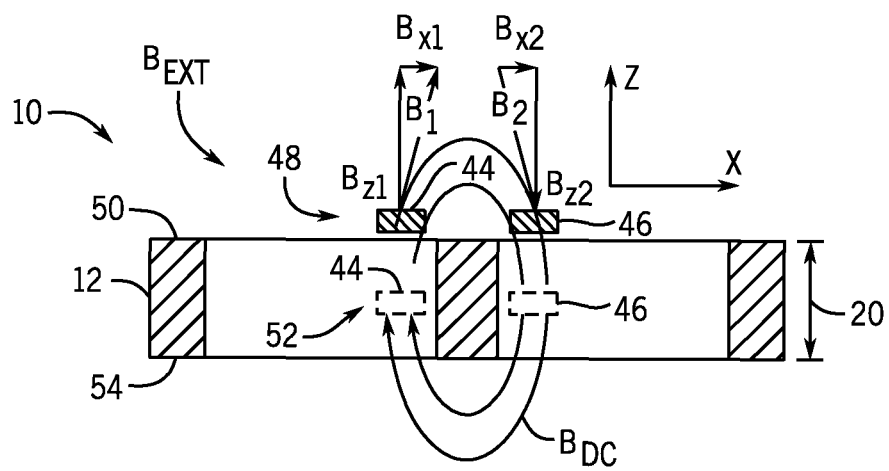
FIG. 2 is a sectional view of the current sensing assembly of FIG. 1 according to an embodiment of the invention.

The embodiments of the invention set forth herein relate to an apparatus that senses an electrical current in a conductor. Referring first to FIGS. 1 and 2, a current sensing assembly 10 includes a conductor 12 or bus bar having a first slot 14 and a second slot 16 formed in a current sensing region 18 of the conductor 12. In one embodiment, conductor 12 is constructed of a magnetic material such as ferrous iron or steel, as non-limiting examples. As shown in FIG. 2, slots 14, 16 extend through a thickness 20 of conductor 12. First and second slots 14, 16 are sized and positioned on conductor 12 to form a first current path region 22 located adjacent a left edge 24 of conductor 12, a central current path region 26, and a second current path region 28 located adjacent the right edge 30 of conductor 12. As shown, the first current path region 22 is positioned between the left edge 24 of conductor 12 and first slot 14 while the second current path region 28 is positioned between right edge 30 of conductor 12 and second slot 16. Current flow, $I_{DC}$, through central current path region 26 travels in a substantially linear conductive path for current $I_{DC3}$ between a first end 32 and a second end 34 of current sensing region 18, as shown in FIG. 1. Note that although the current is indicated as $I_{DC}$ herein, the current may be AC or DC in character according to alternative embodiments.

In a preferred embodiment slots 14, 16 have a common slot width 36 and slot height 38 and first and second current path regions 22, 28 have a common width 40. However, it is contemplated that these dimensions may be varied in alternative embodiments. Central current path region 26 has a width 42, which may be equal to or differ from thickness 40 according to various embodiments. Slots 14, 16 may be constructed having a generally rectangular shape with square corners or, alternatively, first slot 14 and second slot 16 may be constructed having rounded edges, as shown in FIG. 1, which facilitates manufacture and current flow through current sensing region 18. The rounded edges help prevent heat damage to conductor 12 as a result of current concentrating at the edges of slots 14, 16. Thus, rounded edge slot designs may be particularly advantageous in applications where conductor 12 experiences high current levels.

A first magnetic field sensor 44 is aligned with the first slot 14 and a second magnetic field sensor 46 is aligned with the second slot 16. First and second magnetic field sensors 44, 46 comprise a pair of sensors capable of measuring the amplitude of a magnetic field. According to various embodiments, first and second magnetic field sensors 44, 46 may be Hall Effect sensors, Fluxgate sensors, Magento-Resistive (MR) sensors, Anisotropic Magneto-Resistive (AMR) sensors, or Giant Magneto-Resistive (GMR) sensors. In such embodiments, first and second magnetic field sensors 44, 46 may be positioned at a first position 48 aligned with a top or upper surface 50 of the conductor 12, as shown in FIG. 2. Alternatively, first and second magnetic field sensors 44, 46 may be positioned at a second position 52 within their respective first and second slots 14, 16 between the upper surface 50 and the bottom or lower surface 54 of conductor 12. In one embodiment, sensors 44, 46 are centered between the upper and lower surfaces 50, 54 of conductor 12 in the second position 52, therefore placing sensors 44, 46 perpendicular to the magnetic field, $B_{DC}$, produced by current $I_{DC3}$. In both the first and second positions 48, 52, magnetic field sensors 44, 46 are aligned both across the width 56 of conductor 12 and at a common location on the z-axis conductor 12, as shown in FIGS. 1 and 2.

Figure 3:
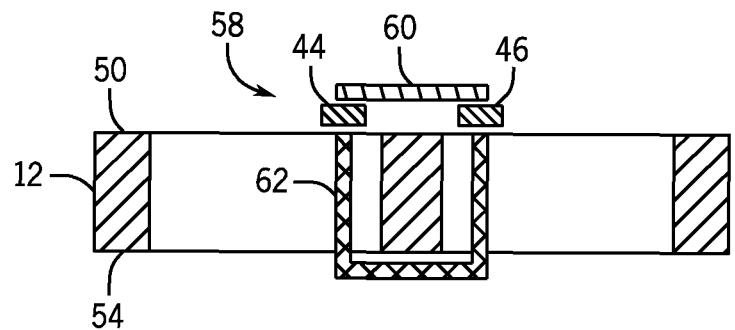
FIG. 3 is a sectional view of the current sensing assembly of FIG. 1 according to another embodiment of the invention.

In an alternative embodiment shown in FIG. 3, first and second magnetic field sensors 44, 46 are located in the first position 48 at the upper surface 50 and a magnetic core assembly 58 is positioned proximate the first and second magnetic field sensors 44, 46. Magnetic core assembly 58 operates to amplify the magnetic field acting on the first and second magnetic field sensors 44, 46. In the illustrated embodiment, magnetic core assembly 58 comprises a top bar 60 and a u-shaped pin 62 that are positioned to surround first and second magnetic field sensors 44, 46. However, it is contemplated that magnetic core assembly 58 may be constructed in alternative geometric configurations, such as, for example, a pair of pins, with one pin positioned in each slot 14, 16, top bar 60 alone, or u-shaped pin 62 alone, or two u-shaped pins 62. Magnetic core assembly 58 may be constructed of a ferrous material, such as steel, and are designed to concentrate and direct the magnetic flux created by current flow, $I_{DC3}$, in central current path region 26.

Figure 4:
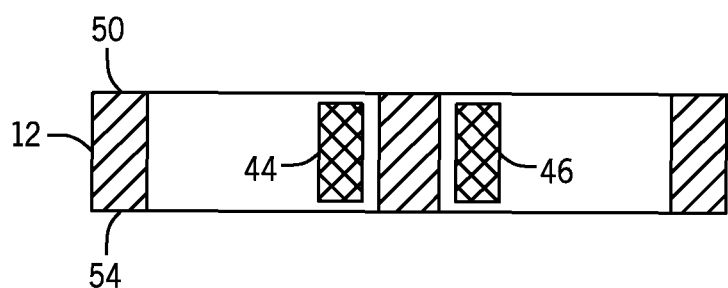
FIG. 4 is a sectional view of the current sensing assembly of FIG. 1 according to another embodiment of the invention.
Figure 5:
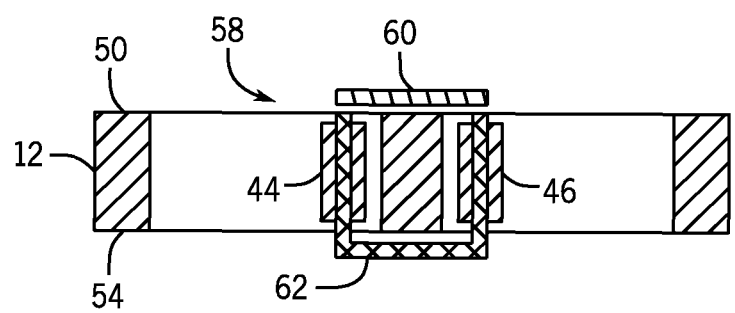
FIG. 5 is a sectional view of the current sensing assembly of FIG. 1 according to another embodiment of the invention.

In the alternative embodiment illustrated in FIG. 4, first and second magnetic field sensors 44, 46 comprise Rogowski coils or current transformer (CT) coils positioned within respective slots 14, 16 between the upper surface 50 and lower surface 54 of conductor 12. These Rogowski coils or CT coils may be combined with magnetic core assembly 58 in the alternative embodiment illustrated in FIG. 5.

Referring again to FIGS. 1 and 2, current $I_{DC}$ flows through the length 64 of conductor 12 in the general direction of arrow 66. Slots 14, 16 direct the flow of current $I_{DC}$ through current sensing region 18 such that a first portion of the total current, $I_{DC1}$, flows through left current path region 22 in the general direction of arrow 68, a second portion of the total current, $I_{DC2}$, flows through right current path region 28 in the general direction of arrow 70, and the remaining portion of the total current, $I_{DC3}$, flows through central current path region 26 in the general direction of arrow 72. The current, $I_{DC3}$, flowing within central current path region 26 induces a magnetic field, $B_{DC}$, that passes through the first and second magnetic field sensors 44, 46.

Because first and second magnetic field sensors 44, 46 are disposed on opposing sides of conductor 12, the z-direction component of the magnetic field, $B_{Z1}$, passing through first magnetic field sensor 44 is opposite the z-direction component of the magnetic field, $B_{Z2}$, passing through second magnetic field sensor 46, as shown in FIG. 2. Therefore, the output values from first and second magnetic field sensors 44, 46 can be subtracted from one another to achieve two times the signal magnitude. Current sensing assembly 10 thus has enhanced resolution over prior art devices that incorporate a single magnetic field sensor.

First and second magnetic field sensors 44, 46 may also be affected by an external magnetic field, $B_{EXT}$, from nearby electrical machines or nearby electrical conductors. Due to the close proximity of first and second magnetic field sensors 44, 46 to one another, the external magnetic field, $B_{EXT}$, will produce a relatively uniform magnetic field that acts in the same direction for each magnetic field sensor 44, 46. The effects of the external magnetic field, $B_{EXT}$, on sensors 44, 46 are substantially cancelled by subtracting the output values from first and second magnetic field sensors 44, 46 from one another. As such, current sensing assembly 10 is relatively immune or insensitive to the external magnetic field, $B_{EXT}$.

The uniformity of the external magnetic field, $B_{EXT}$, is inversely proportional to the distance from the source of the external magnetic field, $B_{EXT}$. Therefore, current sensing assembly 10 may be constructed with improved immunity to the external magnetic field, $B_{EXT}$, by reducing the distance between first and second magnetic field sensors 44, 46 by positioning sensors 44, 46 proximate the inner edges of slots 14, 16, as shown in FIG. 1, and/or by reducing the width 42 of the path between slots 14, 16. The close positioning of sensors 44, 46 minimizes the difference in the magnitude of a non-uniform external magnetic field acting on first and second magnetic field sensors 44, 46.

Figure 6:
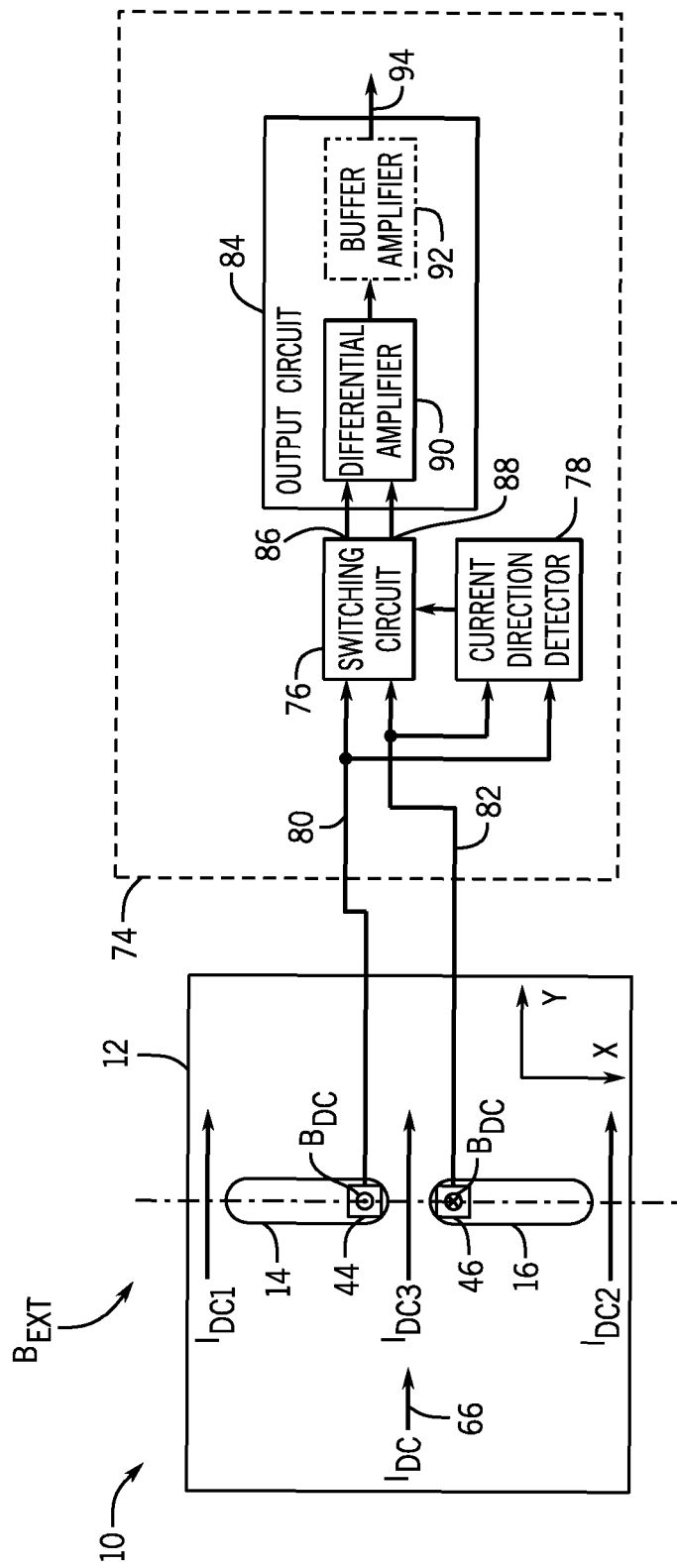
FIG. 6 is a schematic top view of a circuit assembly electrically connected to the current sensing assembly of FIG. 1 according to an embodiment of the invention.

In one embodiment, the outputs of first magnetic field sensor 44 and second magnetic field sensor 46 are electrically connected to a circuit assembly 74 and, in particular, to a switching circuit 76 and to a current direction detector 78 of circuit assembly 74, as illustrated in FIG. 6. Switching circuit 76 receives a voltage signal 80 from first magnetic field sensor 44 and a voltage signal 82 from second magnetic field sensor 46. These voltage signals 80, 82 are output by switching circuit 76 to an output circuit 84 by way of a first output 86 and a second output 88 of switching circuit 76. When switching circuit 76 is in a first condition, it outputs the voltage signal 80 from sensor 44 to first output 86 and the voltage signal 82 from sensor 46 to second output 88. When the switching circuit 76 is in a second condition, it outputs the voltage signal 82 from sensor 46 to the first output 86 and the voltage signal 80 from sensor 44 to the second output 88. In the exemplary embodiment illustrated in FIG. 6, the current direction detector 78 is structured to control switching circuit 76 to be in the first condition when the first voltage signal 80 is greater than the second voltage signal 82 and to be in the second condition when the second voltage signal 82 is greater than the first voltage signal 80. Thus, switching circuit 76 will output the greater of the first and second voltage signals 80, 82 to first output 86 and the lesser of the first and second voltage signals 80, 82 to second output 88.

Current direction detector 78 also receives the voltage signal 80 from first magnetic field sensor 44 and the voltage signal 82 second magnetic field sensor 46. Current direction detector 78 uses the voltage signals 80, 82 to determine the direction of the current $I_{DC}$ through conductor 12. In particular, current direction detector 78 determines the direction of the current $I_{DC}$ flowing through conductor 12 based on which one of the first and second voltage signals 80, 82 that are output by the first and second magnetic field sensors 44, 46 is greater. The current direction detector 78 then outputs a switching signal to switching circuit 76 based on the detected direction of current flow to control switching circuit 76 to operate in one of the first condition and the second condition, described above.

An output circuit 84 including a differential amplifier 90 is electrically coupled to the first and second outputs 86, 88 of switching circuit 76. The differential amplifier 90 is structured to receive the first and second voltage signals 80, 82 from switching circuit 76 and amplify the voltage difference between voltage signals 80, 82. The amplified voltage difference is a ground referenced signal that is output to buffer amplifier 92.

As previously described, switching circuit 76 outputs the greater of the first and second voltage signals 80, 82 to first output 86 and the lesser of first and second voltage signals 80, 82 to second output 88. Differential amplifier 90 is oriented such that it subtracts the lesser of the first and second voltage signals 80, 82, received from second output 88, from the greater of the first and second voltage signals 80, 82, received from first output 86. Thus, differential amplifier 90 ensures that the amplified voltage difference always has a positive value regardless of the direction of the flow of current $I_{DC}$.

In one embodiment, output circuit 84 also includes an optional buffer amplifier 92 (shown in phantom) that receives the amplified voltage difference from differential amplifier 90 and further amplifies the voltage difference. Buffer amplifier 92 serves as a buffer between current sensing assembly 10 and other circuit components and may provide scaling and/or level shifting functions. It is contemplated that buffer amplifier 92 may be used to match the output level range of output circuit 84 to that used by subsequent circuitry, such as, for example and without limitation, control and trip function circuitry in a circuit breaker. It is further contemplated that buffer amplifier 92 may be powered by a separate supply voltage that would allow buffer amplifier 92 to further amplify the amplified voltage difference beyond levels available from other components of current sensing assembly 10.

The output 94 of output circuit 84 is a voltage signal that is proportional to the magnitude of the current $I_{DC}$ flowing through conductor 12 regardless of which direction the current $I_{DC}$ is flowing.

Referring now to FIGS. 7 and 8, a current sensing assembly 96 is illustrated according to another embodiment of the invention. Current sensing assembly 96 includes a number of similar components to those described with respect to current sensing assembly 10 (FIG. 1). Therefore, elements and components common to current sensing assemblies 10 and 96 will be discussed relative to the same reference numbers as appropriate.

In addition to the components common with current sensing assembly 10, current sensing assembly 96 includes a first slot 98 and a second slot 100 both formed through conductor 12 within a current sensing region 102 of conductor 12. Slots 98, 100 have a common width 104 and height 106 in one non-limiting embodiment. As shown, first slot 98 and second slot 100 are offset from one another along the y-axis of the conductor 12 by a distance 108. A left end 110 of first slot 98 is positioned at a distance 112 from a left edge 24 of conductor 12. Likewise, a right end 114 of second slot 100 is positioned at a distance 116 from a right edge 30 of conductor 12. In one embodiment, distance 112 is substantially equal to distance 116, however, these distances 112, 116 may differ in alternative embodiments. In the illustrated embodiment, first and second magnetic field sensors 44, 46 are positioned adjacent the upper surface 50 of conductor 12. Alternatively, first and second magnetic field sensors 44, 46 may be located within respective slots 98, 100.

A right end 118 of first slot 98 partially overlaps a left end 120 of second slot 100, thereby permitting first and second magnetic field sensors 44, 46 to be aligned with one another along the centerline 122 of conductor 12, which is parallel to the overall direction 66 of current flow, $I_{DC}$, through conductor 12. The right end 118 of first slot 98 and the left end 120 of second slot 100 are positioned a distance 124 from the common y-axis 122. As shown, the arrangement of slots 98, 100 creates a curvilinear conductive path in the general direction of arrow 126 for current flow $I_{DC3}$ between a first end 128 and a second end 130 of current sensing region 102. As a result of this curvilinear conductive path, current $I_{DC3}$ travels approximately 90 degrees around each of magnetic field sensors 44, 46.

As shown in FIG. 7, slots 98, 100 are positioned such that a first portion of the total current, $I_{DC1}$, flows through a left current path region 132 in the general direction of arrow 134 and a second portion of the total current, $I_{DC2}$, flows through a right current path region 136 in the general direction of arrow 138. The remaining portion of the total current, $I_{DC3}$, flows through a central current path region 140 between slots 98, 100 in the general direction of arrow 126.

Similar to the current sensor configuration of FIG. 1, the z-direction component of the magnetic field, $B_{Z1}$, at first field sensor 44 is opposite the z-direction component of the magnetic field, $B_{Z2}$, at second magnetic field sensor 46, as shown in FIG. 8. Therefore, an output value twice the signal magnitude from one sensor 44, 46 may be achieved by subtracting the output value of one magnetic field sensor 44, 46 from the other magnetic field sensor 46, 44.

Typically the largest source of the external magnetic field, $B_{EXT}$, is from the current in another phase of a multi-phase system. For example, the current in Phase-B produces a magnetic field than acts on the current sensors for Phase-A. By aligning first and second magnetic field sensors 44, 46 along a common y-axis 122, sensors 44, 46 are located equidistant from an adjacent conductor and experience a relatively uniform effect from the external magnetic field, $B_{EXT}$. Therefore, the configuration of current sensing assembly 96 provides a significant immunity to external magnetic field, $B_{EXT}$.

Figure 9:
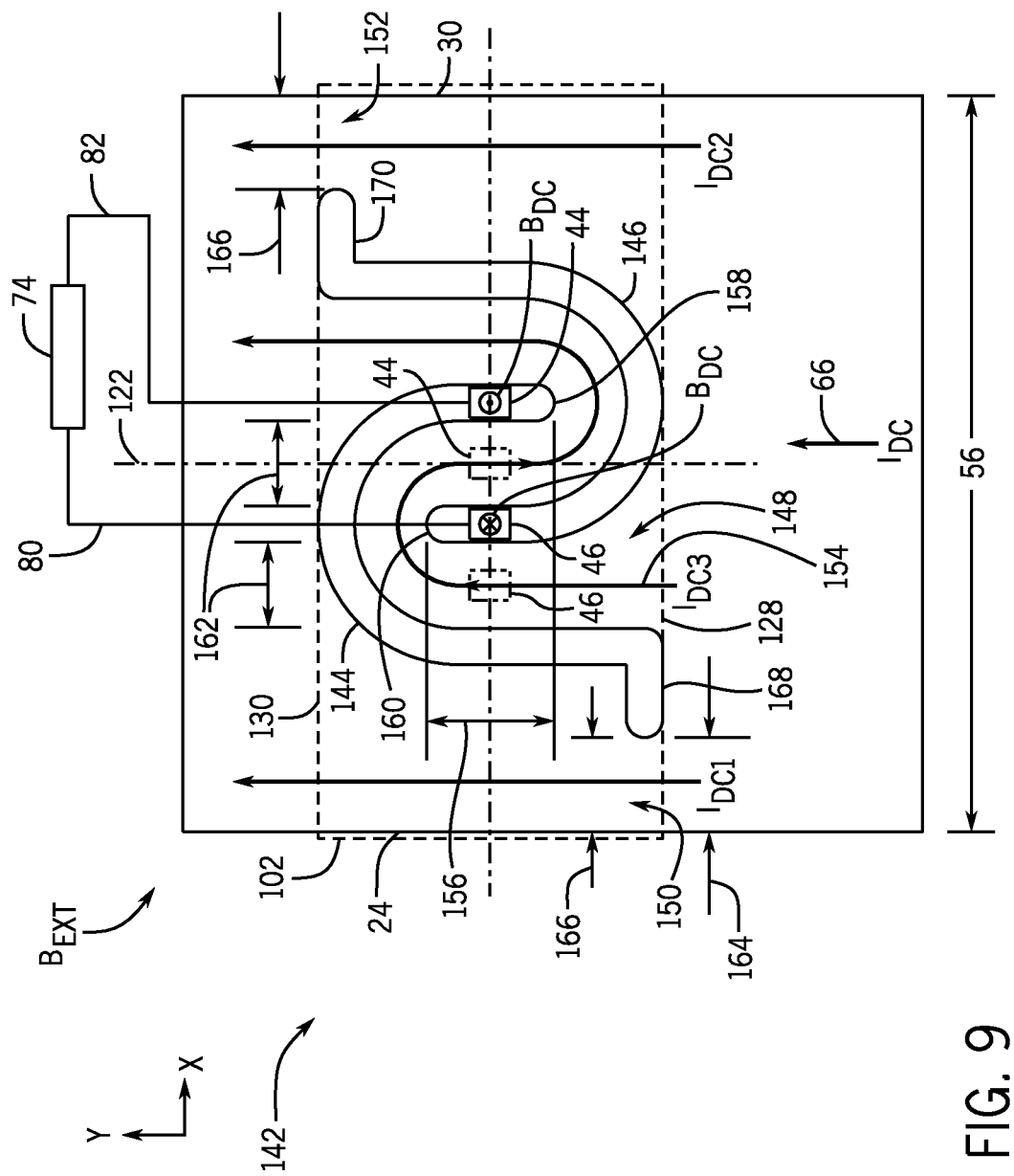
FIG. 9 is a schematic top view of a current sensing assembly incorporated into a conductor according another embodiment of the invention.

Referring now to FIG. 9, a current sensing assembly 142 is illustrated according to an embodiment having a pair of curved slots 144, 146 formed within current sensing region 102 of conductor 12. Components of current sensing assembly 142 similar to those described with respect to current sensing assembly 10 (FIG. 1) will be discussed relative to the same reference numbers as appropriate.

Slots 144, 146 are positioned to direct portions of the total current $I_{DC}$ 66 in one of three current path regions 148, 150, 152 within conductor 12. In particular, a first portion of the total current, $I_{DC1}$, is directed through left current path region 150, a second portion of the total current, $I_{DC2}$, is directed through right current path region 152, and the remaining portion of the total current, $I_{DC3}$, is directed through a central current path region 148. Similar to the embodiment of FIG. 7, central current path region 148 directs current $I_{DC3}$ in the general direction of arrow 154 through a curvilinear conductive path between first end 128 and second end 130 of current sensing region 102. However, as a result of the curvilinear conductive path formed by slots 144, 146, current $I_{DC3}$ travels approximately 180 degrees around each of sensors 44, 46.

As illustrated in FIG. 9, first magnetic field sensor 44 and second magnetic field sensor 46 are aligned along the width 36 or x-axis of conductor 12. In one embodiment, first and second magnetic field sensors 44, 46 are positioned centered within respective curved slots 144, 146. In this embodiment, sensors 44, 46 may be disposed on or proximate to the upper surface of conductor 12 or placed down into the slots, as illustrated in FIG. 2, for example. In another embodiment, first and second magnetic field sensors 44, 46 are placed on the upper surface of conductor 12 within central current path region 148, as illustrated in the alternative position illustrated in FIG. 9.

The length 156 between respective ends 158, 160 of slots 144, 146, the width 162 of central current path region 148, the width 164 of left current path region 150, and the width 166 right current path region 152 may all be adjusted to achieve a magnetic field magnitude that matches the sensing range of first magnetic field sensor 44 and second magnetic field sensor 46. For example, the respective widths 164, 166 of left current path region 150 and right current path region 152 may be adjusted by varying the lengths of the linear portions 168, 170 of slots 144, 146. Similar to the embodiments illustrated in FIGS. 1 and 7, the magnetic field flux density at the first and second magnetic field sensors 44, 46 is in opposite directions for the two sensors 44, 46. Therefore, the output values of the voltage signal of each sensor 44, 46 can be subtracted to achieve twice the voltage signal magnitude.

Any external magnetic field, $B_{EXT}$, induced from nearby electrical conductors or electrical machines, produces a relatively uniform magnetic field that acts in the same direction for first and second magnetic field sensors 44, 46. Therefore, subtracting the voltage output value of one sensor 44, 46 from the voltage output value of the other sensor 46, 44 will substantially eliminate the signal produced by the external magnetic field, $B_{EXT}$. Improved immunity to any external magnetic field, $B_{EXT}$, may be achieved by reducing the distance between first magnetic field sensor 44 and second magnetic field sensor 46, such as by reducing the width 162 of central current path region 148. Reducing the distance between first and second sensors 44, 46 minimizes the difference in the magnitude of a non-uniform external magnetic field, $B_{EXT}$, acting on sensors 44, 46.

Figure 10:
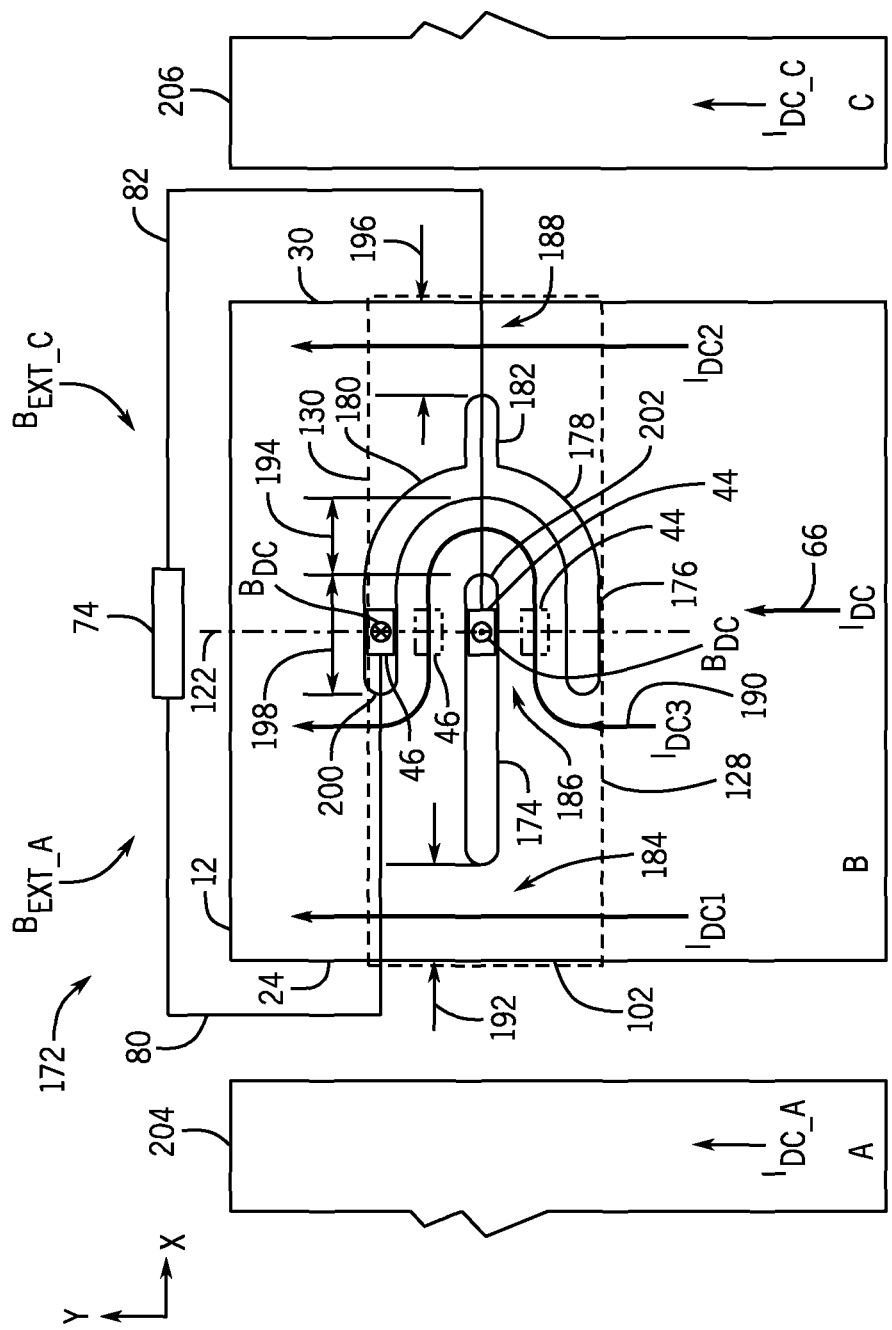
FIG. 10 is a schematic top view of a current sensing assembly incorporated into a conductor according another embodiment of the invention.

A current sensing assembly 172 is illustrated in FIG. 10 according to yet another embodiment of the invention. Again, elements and components common to current sensing assembly 172 and current sensing assembly 10 (FIG. 1) will be referred to herein with similar reference numbers as appropriate. In addition to components common to current sensing assembly 10, the conductor 12 of current sensing assembly 172 has a pair of slots 174, 176 formed therethrough. As shown, slot 174 is generally linear, while slot 176 includes a first curved portion 178, a second curved portion 180, and a linear portion 182 oriented with respect to one another in a generally wishbone or tuning fork shape.

The arrangement of slots 174, 176 creates three current path regions 184, 186, 188 through which respective current portions $I_{DC1}$, $I_{DC2}$, and $I_{DC3}$ of the total current $I_{DC}$ may flow. As shown in FIG. 10, current path region 186 directs current $I_{DC3}$ to follow a curvilinear current path in the general direction of arrow 190 between first end 128 and second end 130 of current sensing region 102. As shown, current path region 186 orients the flow of current $I_{DC3}$ in a direction substantially perpendicular to centerline 122 at the location of centerline 122. Therefore, the magnetic field produced by current $I_{DC3}$ is substantially perpendicular to first and second magnetic field sensors 44, 46. Similar to the embodiment of FIG. 7, current $I_{DC3}$ travels approximately 180 degrees around each of sensors 44, 46 within the curvilinear current path of current sensing region 102.

According to various embodiments, the width 192, 194, 196 of each current path region 184, 186, 188 and the distance 198 between respective ends 200, 202 of slots 174, 176 may be varied such that the magnetic field produced by the current flow through central current path region 186 matches a desired sensing range of first magnetic field sensor 44 and second magnetic field sensor 46. In one embodiment, the length of slot 174 and length of linear portion 182 of slot 176 are adjusted such that the width 192, 196 of current path regions 184, 188 are substantially equal.

First magnetic field sensor 44 and second magnetic field sensor 46 are aligned along a common y-axis 122 of conductor 12. The illustrated embodiment, the common y-axis 122 is the centerline of conductor 12, however, it is contemplated that sensors 44, 46 may be positioned along a common y-axis that is offset from the centerline of conductor 12. Typically, the largest source of external magnetic fields in multi-phase systems is from the current in another phase of the system. For example, current $I_{DC\_A}$ flowing through a Phase-A conductor 204 produces an external magnetic field $B_{EXT\_A}$ on first and second magnetic field sensors 44, 46 located on the adjacent Phase-B conductor 12. Current $I_{DC\_C}$ flowing through a Phase-C conductor 206 likewise produces an external magnetic field $B_{EXT\_C}$ on first and second magnetic field sensors 44, 46. Aligning first and second magnetic field sensors 44, 46 along the length of conductor 12 places sensors 44, 46 equidistant from the adjacent conductors 204, 206 and therefore improves the immunity of current sensing assembly 172 to external magnetic fields $B_{EXT\_A}$ and $B_{EXT\_C}$.

According to embodiments of the invention, first magnetic field sensor 44 and second magnetic field sensor 46 may be located within or above slots 174, 176. While first magnetic field sensor 44 is aligned with slot 174 and second magnetic field sensor 46 is aligned with second curved portion 180 of slot 176 in FIG. 10, it is also contemplated that first magnetic field sensor 44 may be aligned with curved portion 178 of slot 176 and second magnetic field sensor 46 aligned with slot 174 in an alternative embodiment. Alternatively, sensors 44, 46 may be positioned on the upper surface of conductor 12 at locations within central current path 186, as illustrated in dotted lines in FIG. 10.

While embodiments of the invention have been described herein as including three discrete current path regions separated by a pair of slots, it will be appreciated by those skilled in the art that various modifications and alternatives could be developed in light of the overall teachings of the disclosure. For example, it is contemplated that the concepts disclosed herein may be extended to current sensing apparatus that includes four or more discrete current path regions separated by three or more slots. Further, one skilled in the art will recognize that the concepts disclosed herein may be extended to a current sensing apparatus having slots with differing geometry than slots 14, 16 (FIG. 1), slots 98, 100 (FIG. 7), slots 144, 146 (FIG. 9), and slots 174, 176 (FIG. 10). Accordingly, the particular arrangements disclosed herein are meant to be illustrative only and not limiting as to the scope of the inventions disclosed herein.

As described in detail above, embodiments of the present invention provide for a current sensing apparatus having improved immunity to external magnetic fields, enhanced resolution, and a wide sensing range. The current sensing apparatus includes a conductor having a plurality of current path regions formed therein, which are separated by a pair of slots formed through the conductor. A pair of magnetic field sensors is positioned relative to the pair of slots to sense a magnetic field produced by a current flow through one of the current path regions. The current sensing apparatus is constructed such that an external magnetic field, produced by nearby electrical conductors or machines, for example, produces a relatively uniform magnetic field that acts in the same direction for each sensor included within the current sensing apparatus. According to various embodiments, the magnetic field sensors may be aligned along a width of a conductor or bus bar or aligned along a length of the conductor, such as, for example, the centerline of the conductor. Aligning the magnetic field sensors in such a manner minimizes the difference in the magnitude of a non-uniform external magnetic field on the magnetic field sensors. Improved immunity to external magnetic fields may also be achieved by reducing the distance between the magnetic field sensors.

Embodiments of the current sensing apparatus disclosed herein permit current flow within a current sensing region of the conductor to be scaled to produce a magnetic field that matches the sensing range of the magnetic field sensors by providing a plurality of discrete conductive paths for current to flow through the current sensing region. Beneficially, the dimensions of the current sensing region may be adjusted to maximize the sensing range of the magnetic field sensors without negatively affecting the structural integrity of the conductor. The edge current path regions provided on the current sensing apparatus add structural strength to the conductor and provide paths for a portion of the total current to flow.

Therefore, according to one embodiment of the invention, current sensing apparatus includes a conductor configured to carry a current flow, the conductor having a current sensing region formed therein. The current sensing region includes a first edge current path region disposed between a first edge of the conductor and a first slot formed through a thickness of the conductor, a second edge current path region disposed between a second edge of the conductor and a second slot formed through the thickness of the conductor, the second edge opposite the first edge, and a central current path region disposed between the first slot and the second slot. A first magnetic field sensor is aligned with the first slot and a second magnetic field sensor aligned with the second slot.

According to another embodiment of the invention, a current sensing apparatus includes a conductor having a plurality of discrete current path regions formed therein, the plurality of current path regions separated by a plurality of slots formed through a thickness of the conductor. The current sensing apparatus also includes a pair of magnetic field sensors positioned to sense a magnetic field in a central current path region of the plurality of current path regions.

According to yet another embodiment of the invention, a current sensing apparatus includes a bus bar having a plurality of slots formed therein, the bus bar having a first current path region, a second current path region, and a central current path region positioned between the first and second current path regions. A pair of magnetic field sensors is disposed between the first current path region and the second current path region to sense a magnetic field produced by a current flow through the central current path region.

Embodiments of the present invention have been described in terms of preferred embodiments, and it is recognized that equivalents, alternatives, and modifications, aside from those expressly stated, are possible and within the scope of the appending claims.

What is claimed is:
1. A current sensing apparatus comprising:
a conductor configured to carry a current flow, the conductor having a current sensing region formed therein, the current sensing region comprising:
a first edge current path region disposed between a first edge of the conductor and a first slot formed through a thickness of the conductor;
a second edge current path region disposed between a second edge of the conductor and a second slot formed through the thickness of the conductor, the second edge opposite the first edge; and
a central current path region disposed between the first slot and the second slot; and
a first magnetic field sensor aligned with the first slot; and
a second magnetic field sensor aligned with the second slot;
wherein the first and second slots are positioned in the conductor to form a curvilinear current path through the central current path region and linear current paths through the first and second edge current path regions.
2. The current sensing apparatus of claim 1 wherein the first magnetic field sensor is aligned with the second magnetic field sensor along a centerline of the conductor parallel to a general direction of the current flow through the conductor.

3. The current sensing apparatus of claim 1 wherein the first magnetic field sensor is aligned with the second magnetic field sensor along a width of the conductor.

4. The current sensing apparatus of claim 1 wherein the first slot and the second slot are constructed without square corners.

5. The current sensing apparatus of claim 1 wherein the first slot is linear; and
wherein the second slot comprises at least one linear portion and at least one non-linear portion.

6. The current sensing apparatus of claim 1 wherein a portion of the first slot and a portion of the second slot are positioned along a centerline of the conductor.

7. The current sensing apparatus of claim 1 wherein at least a portion of each of the first slot and the second slot is non-linear.

8. The current sensing apparatus of claim 1 wherein the first magnetic field sensor and the second magnetic field sensor comprise one of Hall Effect sensors, Magneto-Resistance sensors, fluxgate sensors, Rogowski sensors, and current transformer coils.

9. The current sensing apparatus of claim 1 wherein a width of the central current path region is less than a width of the first and second edge current path regions.

10. The current sensing apparatus of claim 1 wherein a magnetic field produced by current flow through the central current path region passes through the first and second magnetic field sensors; and
wherein the first magnetic field sensor is aligned with the second magnetic field sensor such that a z-direction component of the magnetic field in the first magnetic field sensor is opposite a z-direction component of the magnetic field in the second magnetic field sensor.

11. A current sensing apparatus comprising:
a conductor having a plurality of discrete current path regions formed therein, the plurality of current path regions separated by a plurality of slots having curved edges formed through a thickness of the conductor;
a pair of magnetic field sensors positioned to sense a magnetic field in a central current path region of the plurality of current path regions; and
a magnetic core assembly comprising a top bar and a u-shaped pin positioned to surround the pair of magnetic field sensors.

12. The current sensing apparatus of claim 11 wherein one magnetic field sensor of the pair of magnetic field sensors is positioned proximate a first side of the central current path region; and
wherein the other magnetic field sensor of the pair of magnetic field sensors is positioned proximate a second side of the central current path region.

13. The current sensing apparatus of claim 11 wherein the pair of magnetic field sensors are positioned adjacent an upper surface of the conductor within the central current path region.

14. The current sensing apparatus of claim 11 wherein the plurality of current path regions of the conductor comprises:
a first current path region; and
a second current path region, wherein the central current path region is positioned between the first and second current path regions.

15. The current sensing apparatus of claim 11 wherein the central current path region comprises a curvilinear current path.

16. A current sensing apparatus comprising:
a bus bar having a plurality of slots formed therein, the bus bar comprising:
a first current path region;
a second current path region; and
a central current path region positioned between the first and second current path regions;
a pair of magnetic field sensors disposed between the first current path region and the second current path region to sense a magnetic field produced by a current flow through the central current path region; and
a circuit assembly electrically connected to the pair of magnetic field sensors, the circuit assembly comprising:
a switching circuit that receives sensing signals from each of the pair of magnetic field sensors and that outputs a greater of the sensing signals at a first output thereof and a lesser of the sensing signals at a second output thereof; and
an output circuit that receives the outputs of the switching circuit and that outputs a signal representative of the current flow through the central current path region based on the outputs of the switching circuit.

17. The current sensing apparatus of claim 16 wherein the pair of magnetic field sensors are disposed within the plurality of slots between a top surface of the bus bar and a bottom surface of the bus bar.

18. The current sensing apparatus of claim 16 wherein the plurality of slots comprise a pair of linear slots having curved edges.

19. The current sensing apparatus of claim 16 wherein the pair of magnetic field sensors are aligned along a centerline of the bus bar.

20. The current sensing apparatus of claim 16 wherein the first current path region comprises a portion of the bus bar located between a first edge of the bus bar and one slot of the plurality of slots; and
wherein the second current path region comprises a portion of the bus bar located between a second edge of the bus bar and another slot of the plurality of slots.

* * * * *